(12) United States Patent
Tzou et al.

(10) Patent No.: US 7,196,925 B1
(45) Date of Patent: Mar. 27, 2007

(54) MEMORY ARRAY WITH CURRENT LIMITING DEVICE FOR PREVENTING PARTICLE INDUCED LATCH-UP

(75) Inventors: Joseph Tzou, Mountain View, CA (US); Jithender Majjiga, San Jose, CA (US); Morgan Whately, San Francisco, CA (US); Thinh Tran, Palo Alto, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 220 days.

(21) Appl. No.: 10/927,583

(22) Filed: Aug. 26, 2004

(51) Int. Cl.
*G11C 11/00* (2006.01)

(52) U.S. Cl. .................. 365/154; 365/189.06; 365/226; 365/230

(58) Field of Classification Search ................ 365/154, 365/189.06, 230.03, 226
See application file for complete search history.

(56) References Cited

U.S. PATENT DOCUMENTS

| | | | |
|---|---|---|---|
| 4,581,673 A | | 4/1986 | Pang |
| 4,922,367 A | | 5/1990 | Hidaka |
| 5,016,214 A | * | 5/1991 | Laymoun .................... 365/154 |
| 5,289,409 A | * | 2/1994 | Reinschmidt ................ 365/154 |
| 5,668,770 A | * | 9/1997 | Itoh et al. .................... 365/227 |
| 5,687,178 A | * | 11/1997 | Herr et al. ................... 714/721 |
| 6,018,488 A | * | 1/2000 | Mishima et al. ......... 365/225.7 |
| 6,504,788 B1 | | 1/2003 | Nii et al. |
| 6,657,911 B2 | * | 12/2003 | Yamaoka et al. ........... 365/226 |
| 6,693,820 B2 | | 2/2004 | Nii et al. |
| 6,696,873 B2 | | 2/2004 | Hazucha et al. |
| 6,934,181 B2 | * | 8/2005 | Chu et al. .................... 365/154 |

OTHER PUBLICATIONS

Chen, John Y., *CMOS Devices and Technology for VLSI*, 1990, pp. 285-294.

* cited by examiner

*Primary Examiner*—Hoai V. Ho
(74) *Attorney, Agent, or Firm*—Bradley T. Sako

(57) ABSTRACT

A memory device can include a group of memory cells, which can be arranged in a column (100) that receives power by way of a first cell supply nodes (106-0 to 106-*m*). A current limiter (110) can be situated between first cell supply nodes (106-0 to 106-*m*) and a power supply (VH), and limit a current (Ilimit) to less than a latch-up holding current (Ihold_lu) for the group of memory cells (100). In a particle event, such as an α-particle strike, a current limiter (110) can prevent a latch-up holding current (Ihold_lu) from developing, thus preventing latch-up from occurring. Current limiter (110) can include p-channel transistors and/or resistors, and thus consume a relatively small area of the memory device.

20 Claims, 6 Drawing Sheets

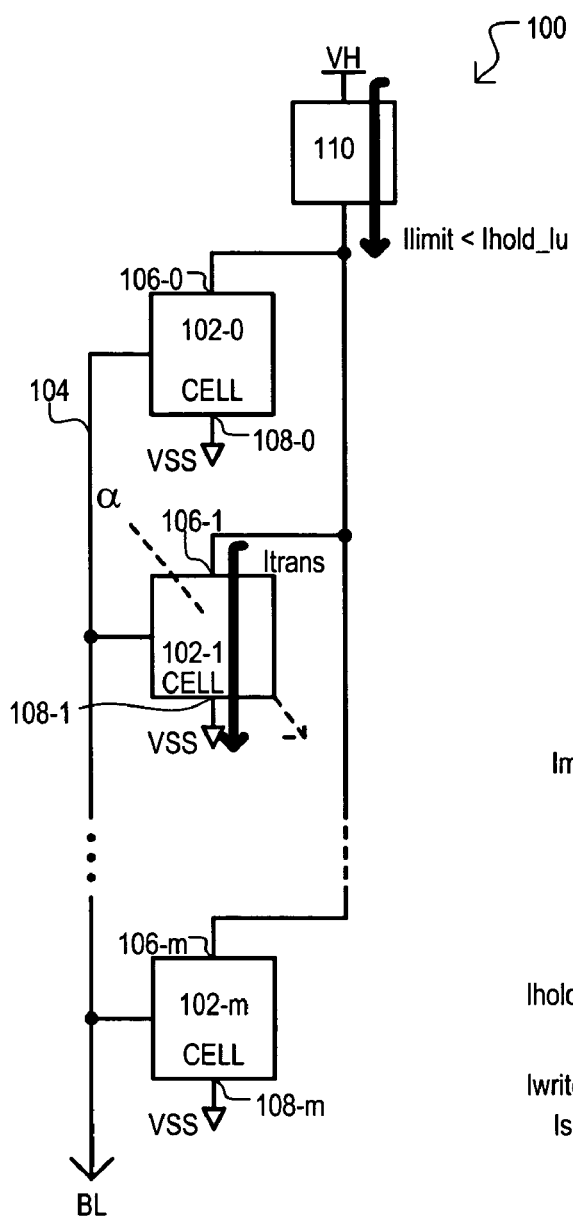
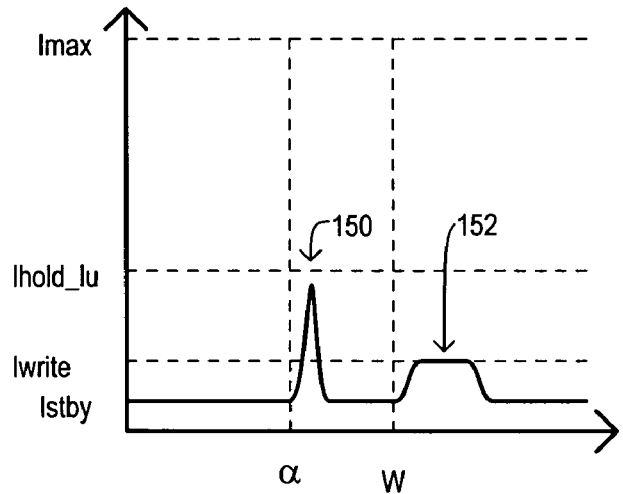
FIG. 1A
FIG. 1B

MEMORY ARRAY WITH CURRENT LIMITING DEVICE FOR PREVENTING PARTICLE INDUCED LATCH-UP

TECHNICAL FIELD

The present invention relates generally to devices having memory arrays, and more particularly to memory arrays with structures for reducing particle induced latch-up.

BACKGROUND OF THE INVENTION

As integrated circuit devices continue to shrink in size errors and failures due to sub-atomic particles have become more problematic. Particle induced errors and failures are most often attributed to alpha particles traveling through a semiconductor substrate and generating electron hole pairs. Such alpha particles may be generated by the decay of elements (e.g., uranium, thorium) or cosmic ray events, as but a few examples.

At larger geometry sizes (i.e., larger well sizes), the number of electron hole pairs generated by a particle may not be sufficient to induce error or failure. However, in smaller geometry structures, such as memory arrays, the number of generated electron hole pairs can be significant with respect to the relatively small size of wells and devices.

One approach to addressing errors resulting from particle induced events is shown in commonly owned, co-pending U.S. patent application Ser. No. 10/823,529 titled SOFT ERROR RESISTANT MEMORY CELL AND METHOD OF MANUFACTURE by Jin et al., filed Apr. 13, 2004, which describes how bit errors can be generated by particle strikes.

However, for complementary metal-oxide-semiconductor (CMOS) type circuits, a particle event can lead to more catastrophic results than loss of a bit value. In particular, a particle induced event can cause the condition known as "latch-up". Such a problem can be of particular consequence in memory cell arrays having tightly integrated CMOS structures, such as static random access memory (SRAM) arrays.

Latch-up in CMOS devices has been studied exhaustively. In a latch-up condition, the forward biasing of a p-n junction results in a sudden, very high current draw. Because latch-up is a feedback response between two parasitic transistors, in order to remain in the latch-up state, the devices require a latch-up "holding" current to sustain the latch-up condition. FIG. 8. shows a typically CMOS structure and corresponding latch-up related parasitic devices. As would be understood from the figure, a latch-up holding current "Ihold_lu" may be given by Ihold_lu=IRW+IPNP+INPN+IRS.

To better understand various aspects of the invention, a typical particle induced latch-up event will now be described with reference to FIGS. 9A and 9B. FIG. 9A is a block schematic diagram of a column of memory cells. FIG. 9B is a graph illustrating current versus time in the latch-up event.

As shown in FIG. 9A, a column of memory cells 900 can include memory cells 902-0 to 902-$n$ commonly connected to one or more bit lines 904. A particle event (a) results in the forward biasing of a p-n junction with memory cell 902-1. As shown in FIG. 9B, the particle event causes the current drawn through memory cell 902-1 to exceed a latch-up holding current Ihold_lu with respect to the parasitic structures associated with memory cell 902-1. As a result, the current drawn by memory cell "Icell" surges to a maximum value Imax, dictated by the structure of the device.

From the above, it is understood that a latch-up holding current for a column of memory cells can be related to the structure of one memory cell in the column and/or a structure shared by adjacent memory cells of a column.

Conventional approaches to preventing latch-up are typically directed to reducing the parasitic resistances giving rise to latch-up. Such parasitic resistances are shown in FIG. 8 as $R_{pn}$ and $R_{pp}$. A first conventional approach includes attempting to reduce $R_{pn}$ or $R_{pp}$ by placing/sizing a well/substrate tap (e.g., 800 or 802) to reduce the corresponding parasitic resistance. Such an approach can result in an unwanted increase in device size, as increased area will be required for each such tap. Further, such an approach can place unwanted design constraints on array layout.

A second conventional approach includes attempting to reduce $R_{pn}$ by forming low resistance n-wells (804). However, such an approach can impose significant process restraints. Further, a lower well resistance can reduce performance of resulting p-channel transistors.

In light of the above, it would be desirable to arrive at some way of increasing a device resistance to latch-up that does suffer from the drawbacks of the above conventional approaches.

SUMMARY OF THE INVENTION

The present invention can include a memory device that includes a plurality of memory cells logically organized into at least two groups. Each group can include at least two memory cells, each of which receives power at a first cell supply node and a second cell supply node. The memory device also includes a current limiting device associated with each group of memory cells. Each current limiting device can be electrically coupled between a first power supply and the first cell supply of nodes of the memory cells in the associated group.

In such an arrangement, a power supply current provided to the memory cells can be limited via a corresponding current limiter. This can prevent latch-up by preventing a latch-up holding current from developing.

According to one aspect of the embodiments, each current limiting device can comprise a p-channel transistor that limits current to a column of memory cells.

In such an arrangement, latch-up protection can be provided on a column-by-column basis with a relatively small increase in overall device size.

According to another aspect of the embodiments, a first power supply can be a high power supply, and current limiting p-channel transistors can have a gate coupled to a low power supply.

In such an arrangement, latch-up protection can be provided on a column-by-column basis with an "always on" transistor.

According to another aspect of the embodiments, the groups of memory cells can be columns of memory cells, with each column having a latch-up holding current value. Further, each current limiting p-channel transistor can have a saturation current that is less than the latch-up holding current of the associated column.

In such an arrangement, a transistor size can provide a desired current limiting effect.

According to another aspect of the embodiments, each current limiting device comprises a resistor and the groups memory cells are columns of memory cells.

In such an arrangement, latch-up protection can be provided on a column-by-column basis with a relatively small increase in overall size.

According to another aspect of the embodiments, each resistor has a resistance value that limits the current to the associated column to less than a latch-up holding current of the column.

In such an arrangement, resistors can prevent a latch-up holding current form developing.

According to another aspect of the embodiments, each memory cell comprises at least one p-channel transistor formed in an n-well having a source coupled to the current limiting device and the groups are columns of memory cells.

Such an arrangement can provide latch-up protection for common memory cell configurations.

According to another aspect of the embodiments, each n-well is shared by p-channel transistor of at least two adjacent memory cells.

Such an arrangement can provide latch-up protection for common memory cell configurations, such as those that share n-well structures between two cells.

According to another aspect of the embodiments, the memory cells comprise static random access memory (SRAM) cells.

In this way, latch-up protection can be provided for an SRAM device.

According to another aspect of the embodiments, each memory cell comprises cross-coupled complementary metal-oxide-semiconductor (CMOS) type inverters having p-channel transistors with sources coupled to the first cell supply node of the memory cell. Even more particularly, each memory cell can be a 6-T SRAM cell.

In this way, latch-up protection can be provided for common SRAM memory cell configurations.

The present invention can also include a method of reducing latch-up susceptibility in a memory array. The method can include the steps of determining a latch-up holding current for a column of memory cells in the memory array. In addition, the method includes placing a current limiting device between an array supply node and memory cell supply nodes of each column that limits a current supplied to the column of cells to less than the latch-up holding current.

In this way, arrays can be modified to be more resistant to particle event induced latch-up with the addition of relatively few circuit elements.

According to one aspect of the embodiments, placing the current limiting device includes placing a p-channel transistors with source-drain path between an array power supply node and the memory cell supply nodes of a corresponding column. Each p-channel transistors can be sized to limit the current to less than the latch-up holding current.

In this way, resistance to latch-up can be accomplished with one transistor per column, which is an advantageously small circuit element.

According to another aspect of the embodiments, the method can also include sizing each p-channel transistor to provide a saturation current that is less then the latch-up holding current of the corresponding column. In addition, placing the current limiting device includes connecting the gate of each p-channel transistor to a low power supply.

In this way, resistance to latch-up can be accomplished with one "always on" transistor per column. This can be an advantageously simple configuration to put in place on the device.

According to another aspect of the embodiments, the step of placing the current limiting device includes placing a resistor between an array power supply node and the memory cell supply nodes of a corresponding column that limits the current to less than the latch-up holding current in event of a particle induced event.

In this way, resistance to latch-up can be accomplished with one resistor per column. This too, can be an advantageously simple configuration to put in place on a device.

According to another aspect of the embodiments, each memory cell can include a high cell supply node and low cell supply node. Further, the step of placing the current limiting device can include placing a current limiting device between a high power supply node and the high cell supply nodes of the memory cells of the corresponding column.

In this way, a current supply can be limited by restricting current with respect to a power supply.

The present invention can also include a memory array having a plurality of impedance elements each coupled between a power supply and a column of memory cells of the memory array. Each impedance element can limit the current through the memory cells of the corresponding column arising from a particle induced event to prevent latch-up in the memory array.

According to one aspect of the embodiments, the plurality of impedance elements can include a plurality of normally on p-channel transistors.

According to one aspect of the embodiments, the plurality of impedance elements comprises a plurality of resistors.

According to one aspect of the embodiments, each column has a latch-up holding current value. In addition, each impedance element can limit the current supplied to the corresponding column to less than the latch-up holding current for the column arising from a particle induced event, but no less than a write current for the column.

BRIEF DESCRIPTION OF THE DRAWINGS

FIG. 1A is a block schematic diagram of a first embodiment of the present invention. FIG. 1B is a graph illustrating the response of the first embodiment to a particle event.

DETAILED DESCRIPTION

Figure 2:
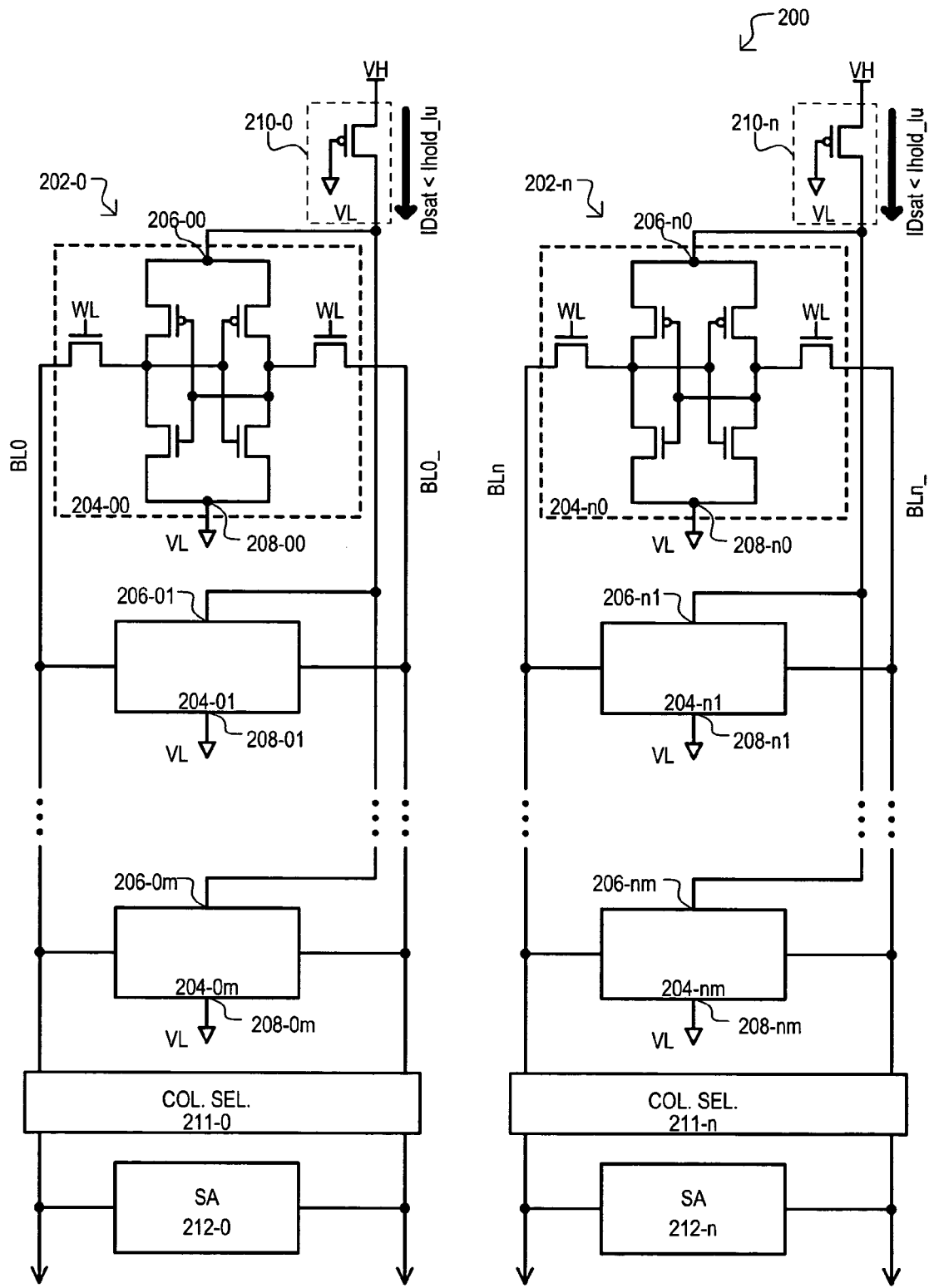
FIG. 2 is a schematic diagram of a second embodiment of the present invention.

Various embodiments of the present invention will now be described in detail with reference to a number of drawings. The embodiments include memory arrays and methods that can provide a latch-up resistant device.

Referring now to FIG. 1A, a memory cell column according to one embodiment is set forth in a block schematic diagram and designated by the general reference character 100. A memory cell column 100 can be one column in a number of columns forming a memory cell array. A memory cell column 100 can include a number of memory cells 102-0 to 102-*m* commonly connected to at least one bit line 104. Each memory cell (102-0 to 102-*m*) of the column can include a first cell supply node (106-0 to 106-*n*) and second supply node (108-0 to 108-*n*) that provide power to the memory cell.

Unlike conventional arrangements, the embodiment of FIG. 1A also includes a current limiter 110 connected between the first cell supply nodes (106-0 to 106-*n*) of the column and a power supply (VH). A current limiter 110 can limit the current drawn by a column of memory cells (102-0 to 102-*m*) to less than a latch-up holding current (lhold_lu) for the column.

As will be recalled, a latch-up holding current (lhold_lu) can be determined according to the physical structure of memory cells in a memory cell array. Such a value can be determined according to existing latch-up simulation, and/or experimentally by testing a given column structure.

Referring now to FIGS. 1A and 1B, a response of a column of memory cells to a particle event will now be described.

Prior to a particle event, memory cells (102-0 to 102-*m*) can draw a standby current (Istby) when not being accessed by a read or write operation, for example. As shown in FIG. 1A, in a particle event, a memory cell 106-1 may be struck by an alpha particle (α), or the like, resulting the generation of electron hole pairs within the memory cells. Such an event can forward bias a p-n junction within memory cell 106-1, resulting in a sudden increase in current drawn by the memory cell. This is shown in FIG. 1B by an increase in current "Ilimit" 150 provided by current limiter 110 from the standby current level. Such an increase can be mainly due to a transient current "Itrans" drawn by the memory cell 102-1 due to the particle strike.

However, because current limiter 110 limits the current drawn to below a latch-up holding current (lhold_lu), the necessary feedback for latch-up to occur is prevented. Consequently, the latch-up is avoided and a column 100 can return to drawing a standby current (Istby).

In this way, a current limiter 110 can limit the current drawn by a column of memory cells to below a latch-up standby level, thereby preventing latch-up from occurring in response to a particle event.

FIG. 1B also shows a resulting current drawn in response to a write operation (shown by W). As but one particular example, in a worst-case write operation, a latch in one state may have to be "overpowered" to flip to the opposite state. Such an operation can temporarily draw a write current. As understood from the figure, the current drawn in a write operation "Iwrite" can be less than the latch-up holding current "Ihold_lu". Thus, in the embodiment shown, a current limiter 110 can limit a current to less than a latch-up holding current "Ihold_lu", but greater than a write current "Iwrite".

Referring now to FIG. 2, a memory cell array according to a second embodiment is set forth a block schematic diagram and designated by the general reference character 200. A memory cell array 200 can include a number of columns (202-0 to 202-*n*) that can each include a number of memory cells (204-00 to 204-*nm*). Each memory cell (204-00 to 204-*nm*) can receive power by way of a first cell supply node (206-00 to 206-*nm*) and second cell supply node (208-00 to 208-*nm*).

In the very particular example of FIG. 2, each memory cell (204-00 to 204-*nm*) can be connected to a corresponding complementary bit line pair (BL0/BL0_ to BLn/BLn_). Thus, those memory cells (204-00 to 204-0*m*) commonly coupled to bit line pair (BL0/BL0_) can form a memory cell column 202-0, and memory cells (204-*n*0 to 204-*nm*) commonly coupled to bit line pair (BLn/BLn_) can form a memory cell column 202-*n*.

In addition, each memory cell (204-00 to 204-*nm*) in the example of FIG. 2 is a six transistor (6-T) memory cell that includes cross-coupled complementary metal-oxide-semiconductor (CMOS) type inverters that form a latch. Data stored by the latch is accessed by transistors commonly connected to a word line (WL). Latch p-channel transistors within each memory (204-00 to 204-*nm*) can have sources that are commonly connected to first cell supply nodes (206-00 to 206-*nm*), and latch n-channel transistors within each memory (204-00 to 204-*nm*) can have sources that are commonly connected to second cell supply node (208-00 to 208-*nm*). In FIG. 2, second cell supply nodes (208-00 to 208-*nm*) are connected to a second power supply VL.

It is understood that a power supply VH can be a high power supply for the memory array 200, while VL can be a low power supply for the memory array 200. Further, a memory array high power supply can be less than (stepped down), greater than (stepped up), or essentially equal to an external high power supply (i.e., VCC, VDD) provided to an integrated circuit device containing the memory array 200. Similarly, a memory array low power supply can greater than (stepped up), essentially equal to, or in some cases less than (stepped down) an external low power supply (i.e., VSS) provided to an integrated circuit device containing the memory array 200.

In FIG. 2, current limiting devices 210-0 to 210-*n* can correspond to columns 202-0 to 202-*n*, respectively. Each current limiting device (210-0 to 210-*n*) can be connected between a power supply VH and the first cell supply nodes of its respective column. Thus, current limiting device 210-0 is connected to first cell supply nodes of the memory cells within column 202-0, and current limiting device 210-*n* is connected to first cell supply nodes of the memory cells within column 202-*n*.

In FIG. 2, current limiting devices (210-0 to 210-*n*) include p-channel transistors having sources connected to power supply VH, drains commonly connected to memory cells of their respective column, and gates connected to a supply VL. In such an arrangement, p-channel transistor can be "always" on, as the gate-to-source voltage always greater than the threshold voltage while the device is in operation. Such a p-channel transistor can provide current limiting by being appropriately sized to have a saturation current that is less than the limit value. Thus, in the arrangement of FIG. 2, the p-channel transistors of current limiting devices (210-0 to 210-*n*) can have a saturation current "iDsat" that is less than a latch-up holding current "Ihold_lu". In addition, the saturation current "iDsat" can be greater than a write current Iwrite.

FIG. 2 also shows column select circuits (211-0 to 211-*n*) associated with each column for coupling memory cell data to corresponding sense amplifiers (212-0 to 212-*n*). As is well understood by those skilled in the art, such sense amplifiers (212-0 to 212-*n*) can sense data in a read operation by amplifying a voltage differential presented by an accessed data cell and/or write data by driving bit lines according to an input write value.

Of course, sense amplifiers (212-0 to 212-*n*) could be multiplexed between multiple bit lines/bit line pairs.

In this way, always on p-channel transistors can provide current limiting on a column-by-column basis to prevent latch-up from occurring due to particle events and the like.

Figure 3:
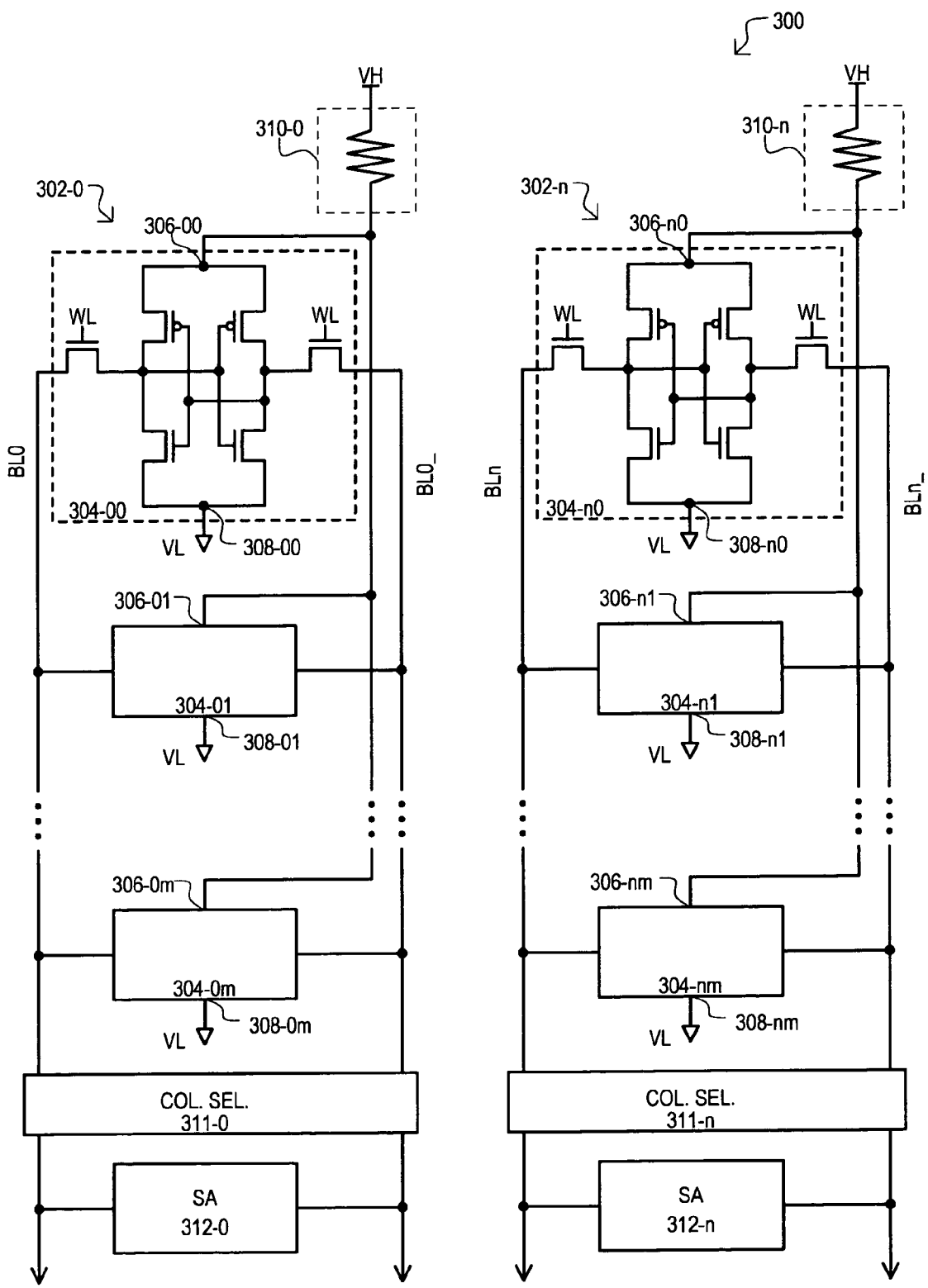
FIG. 3 is a schematic diagram of a third embodiment of the present invention.

Referring now to FIG. 3, a memory cell array according to a third embodiment is set forth in a block schematic diagram and designated by the general reference character 300. A memory cell array 300 can have some of the same general structures as that shown in FIG. 2. Accordingly, like sections will be referred to by the same reference character but with the first digit being a "3" instead of a "2".

A third embodiment 300 can differ from that of FIG. 2 in that current limiting devices (310-0 to 310-$n$) can be resistors instead of transistors. In such an arrangement, resistors of the current limiting devices (310-0 to 310-$n$) can also limit current drawn in a particle event to less than a latch-up holding current. One skilled in the art could arrive at the appropriate resistance needed to limit current by a desired amount according to power supply levels VH, VL and corresponding memory cell characteristics.

In this way, a resistor can provide current limiting on a column-by-column basis to prevent latch-up from occurring due to particle events, and the like.

Figure 4:
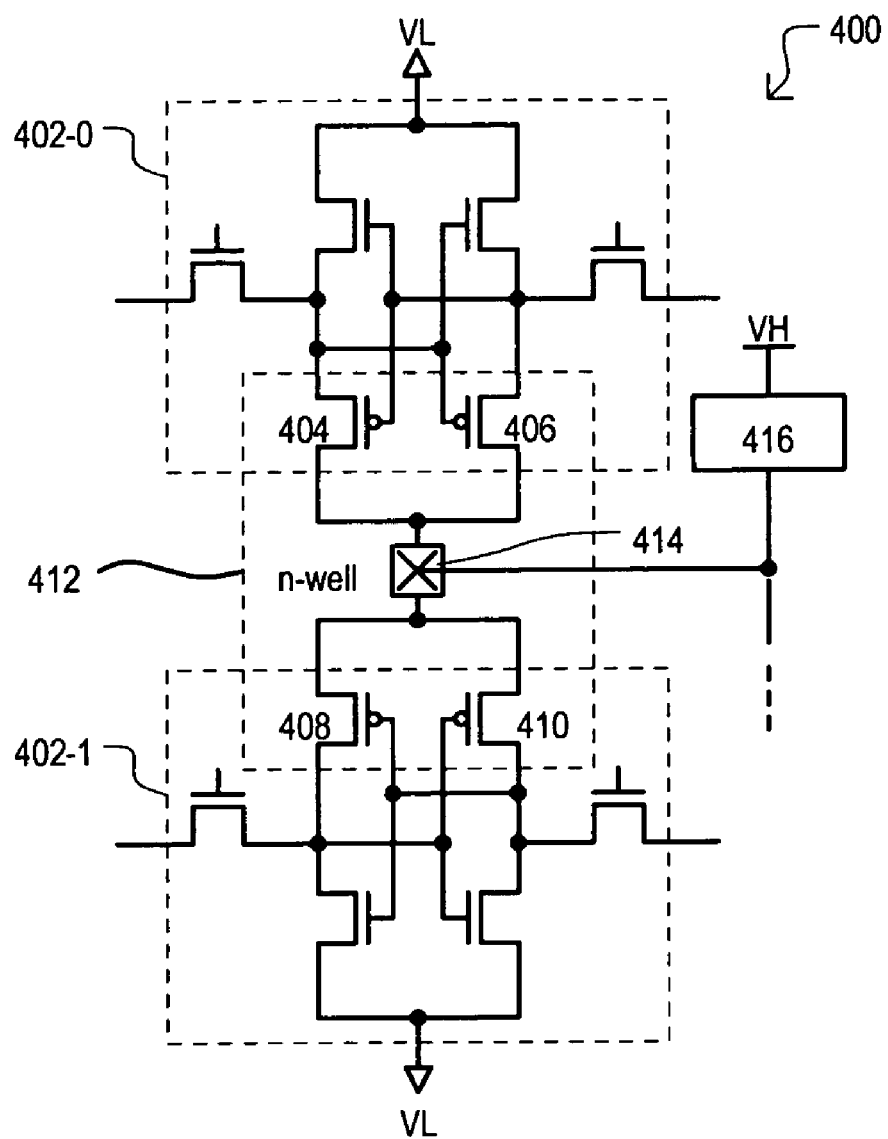
FIG. 4 is a schematic diagram showing a current limiter connection to a shared well arrangement according to one embodiment of the present invention.

It is understood that a memory cell array can include memory cells that share wells and/or other active regions. As a result, a column containing such memory cells can have a latch-up holding current "lhold_lu" that will depend upon the particular resulting structure. FIG. 4 shows one particular example of such an arrangement.

FIG. 4 is a schematic diagram of a portion of a memory cell column 400 showing adjacent memory cells 402-0 and 402-1. Memory cells (402-0 and 402-1) are 6-T type memory cells, and thus include p-channel transistor pairs 404/406 and 408/410. Such p-channel transistors can be formed in a common n-well 412. Such a common n-well 412 can have a common cell power supply node 414 connected to a current limiting device 416 for the column.

It is also understood that while the above current limiting devices (always on p-channel device or resistor) may provide an advantageously compact layout for a resulting memory cell array, the present invention should not necessarily be limited to such structures. One possible alternate structure is shown in FIG. 5.

Figure 5:
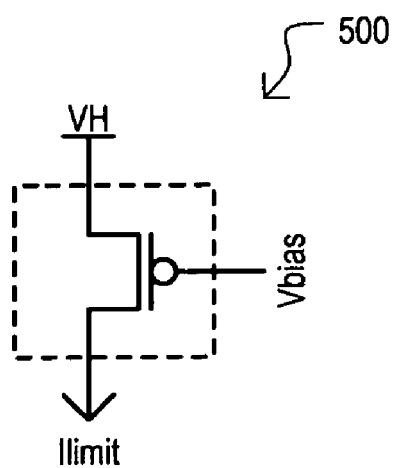
FIG. 5 is a schematic diagram showing a current limiter according to another embodiment of the present invention.

FIG. 5 shows an alternate arrangement in which a current limiting device can rely on a transistor operating in a sub-threshold region. In such an arrangement, a transistor 500 can be biased with a gate voltage to provide a current "Ilimit" that is less than a latch-up voltage holding current "lhold_lu". A biasing voltage Vbias can be an active voltage. As but one example, Vbias can fall in potential during a write operation (e.g., place the transistor into saturation), and then return to current limiting bias voltage to bring latch-up protection back into effect.

Still further, it is understood that the present invention should not necessarily be limited to providing a one-to-one arrangement between current limiters and columns. That is, one current limiter may be shared by multiple columns and/or multiple current limiters can be provided for each column.

While the above embodiments have described cases is in which current limiters are provided to columns of memory cells, the present invention could encompass alternate arrangements. As but one example, current limiters may be provided on a row-wise basis to multiple memory cells. However, in such an arrangement a resulting current drawn by a write operation may limit the amount of memory cells serviced by one current limiter.

Along these same lines, while some of the above embodiments have described particular types of memory cells, the present invention could include alternate memory cell types. As but one example, memory cells can include 4-T cells that utilize pull-up resistors and the like.

Having described the general structure of various embodiments, a method for forming a memory cell array according to one embodiment will now be described.

Figure 6:
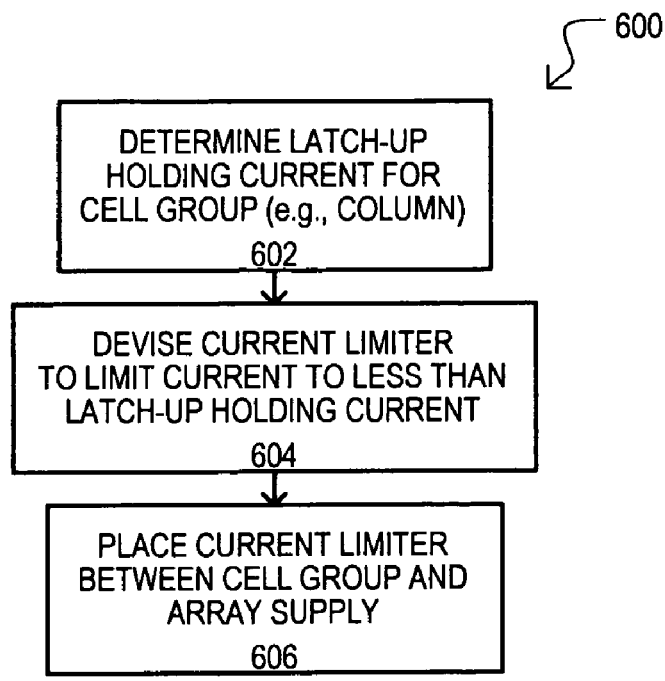
FIG. 6 is a flow diagram of a method according to one embodiment of the present invention.

FIG. 6 is a flow diagram showing the formation of a memory cell array according to one embodiment. The method 600 can include determining a latch-up holding current (lhold_lu) for a group of memory cells (step 602). Such a step can include utilizing existing latch-up simulation models for a given structure and/or experimentally testing a structure.

A method 600 may further include devising a current limiter (step 604). In the case of a transistor, such a step can include designing a transistor with the appropriate W/L size to provide a saturation current below the latch-up holding current. In addition or alternatively, such a step can include testing a range of transistor sizes and selecting the size according to test results. In a similar fashion, the case of a resistor; such a step can include designing a resistor with the appropriate resistance to limit current to below the latch-up holding current, and/or testing a range of resistance values and selecting a resistance value according to test results.

A method 600 can further include placing a current limiter between the groups of cells and an array power supply (step 606). Such a step can include designing current limiters into an existing memory cell array, such as on the periphery of the array, as but one example.

Figure 7:
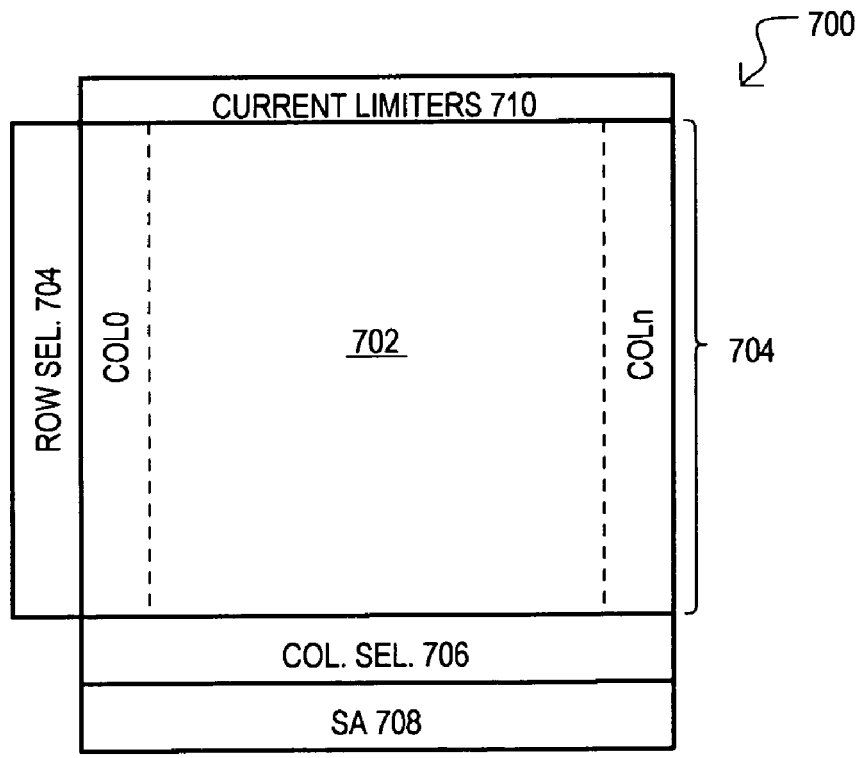
FIG. 7 is a top plan view showing a general layout of an array according to one embodiment of the present invention.
Figure 8:
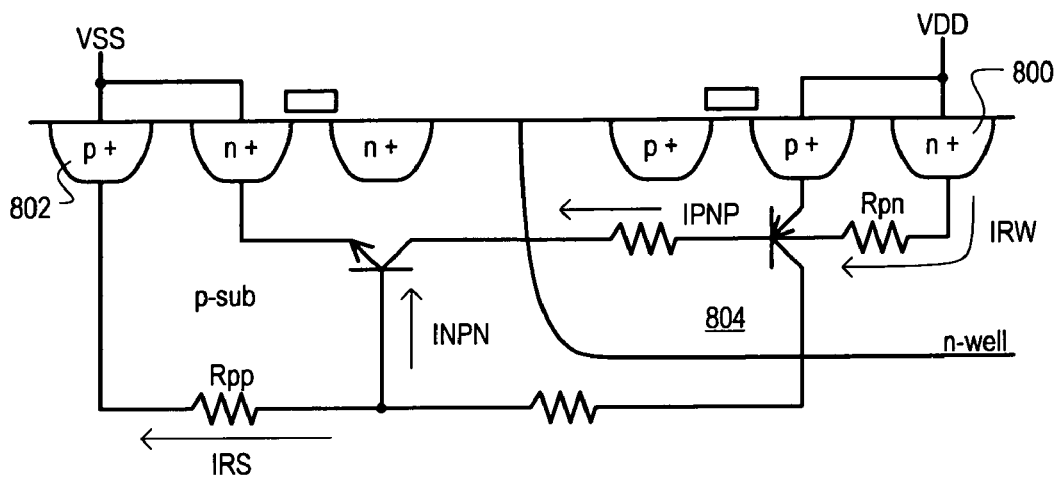
FIG. 8 is a diagram illustrating parasitic structures in a typical complementary metal-oxide-semiconductor (CMOS) type device that can give rise to latch-up.
Figure 9A:
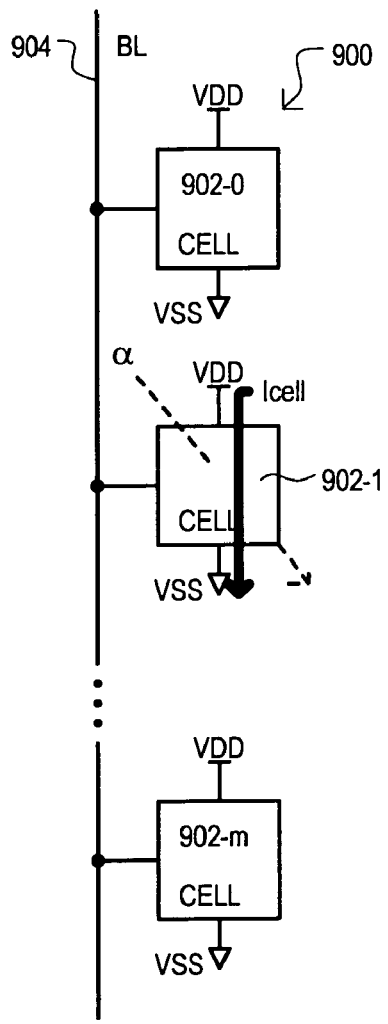
FIG. 9A block schematic diagram of a conventional column of memory cells in a latch-up inducing particle event.
Figure 9B:
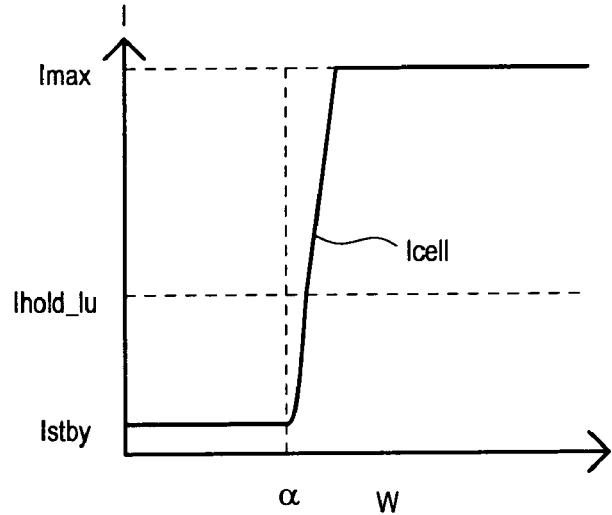
FIG. 9B is a graph illustrating current drawn during the latch-up event of FIG. 9A.

Referring now to FIG. 7, a general layout of memory cell array according to one embodiment is set forth in a top plan view. FIG. 7 shows a memory cell array 700 that can include a number of memory cells 702 arranged in a matrix, including a number of columns COL0 to COLn. Data stored in memory cells 702 can be accessed by row decoder 704 and column decoder 706. Such data can be amplified by sense amplifiers 708.

Memory cell array 700 may also include current limiting devices 710 which may be formed on the periphery of the memory cells 702. As noted above, whether implemented as transistors and/or resistors, current limiting devices 710 can require relatively small area with respect to overall array size.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
   a plurality of memory cells logically organized into at least two groups, each including at least two memory cells, the groups of memory cells being columns of memory cells;
   each memory cell receiving power at a first cell supply node; and
   a current limiting device associated with each group, each current limiting device being electrically coupled between a first power supply and the first cell supply of nodes of the memory cells in the associated group.

2. The memory device of claim 1, wherein:
each current limiting device comprises a p-channel transistor.

3. The memory device of claim 2, wherein:
the first power supply is a high power supply; and
the p-channel transistor of each current limiting device has a gate coupled to a low power supply.

4. The memory device of claim 2, wherein:
each column has a latch-up holding current value; and
each p-channel transistor has a saturation current that is less than the latch-up holding current of the associated column.

5. The memory device of claim 1, wherein:
each current limiting device comprises a resistor.

6. The memory device of claim 5, wherein:
each resistor has a resistance value that limits the current to the associated column to less than a latch-up holding current of the column.

7. The memory device of claim 1, wherein:
each memory cell comprises at least one p-channel transistor formed in an n-well having a source coupled to the current limiting device.

8. The memory device of claim 7, wherein:
the n-well is shared by p-channel transistors of at least two adjacent memory cells.

9. The memory device method of claim 1, wherein:
the memory cells comprise static random access memory (SRAM) cells.

10. The memory device of claim 9 wherein:
each memory cell comprises cross-coupled complementary metal-oxide-semiconductor (CMOS) type inverters having p-channel transistors with sources coupled to the first cell supply node of the memory cell.

11. The memory device of claim 9, wherein:
each memory cell comprises a six transistor (6-T) SRAM cell.

12. A method of reducing latch-up susceptibility of a memory array, comprising the steps of:
determining a latch-up holding current for a group of memory cells in the memory array; and
placing a current limiting device between an array supply node and memory cell supply nodes of each group of memory cells that limits a current supplied to the column of cells to less than the latch-up holding current of the group of memory cells.

13. The method of claim 12, wherein:
placing the current limiting device includes placing a p-channel transistor with a source-drain path between an array power supply node and the memory cell supply nodes of a corresponding column of memory cells, the p-channel transistors being sized to limit the current to less than the latch-up holding current.

14. The method of claim 13, wherein:
the sizing each p-channel transistor includes sizing the p-channel transistor to provide a saturation current that is less than the latch-up holding current of the corresponding column; and
placing the current limiting device includes connecting the gate of each p-channel transistor to a low power supply.

15. The method of claim 12, wherein:
the step of placing the current limiting device includes placing a resistor between an array power supply node and the memory cell supply nodes of a corresponding column of memory cells, each resistor limiting the current to less than the latch-up holding current in event of a particle induced event.

16. The method of claim 12, wherein:
each memory cell includes a high cell supply node and low cell supply node; and
the step of placing the current limiting device includes placing the current limiting device between a high power supply node and the high cell supply nodes of the memory cells of a corresponding column of memory cells.

17. A memory array, comprising:
a plurality of impedance elements each coupled between a power supply and a column of memory cells of the memory array, each impedance element limiting the current through the memory cells of the corresponding column arising from a particle induced event to prevent latch-up in the memory array.

18. The memory array of claim 17, wherein:
the plurality of impedance elements comprises a plurality of normally on p-channel transistors.

19. The memory array of claim 17, wherein:
the plurality of impedance elements comprises a plurality of resistors.

20. The memory array of claim 17, wherein:
each column has a latch-up holding current value and write current value; and
each impedance element limits the current supplied to the corresponding column to less than the latch-up holding current for the column arising from a particle induced event and no less than the write current value.

* * * * *

UNITED STATES PATENT AND TRADEMARK OFFICE
CERTIFICATE OF CORRECTION

PATENT NO. : 7,196,925 B1 Page 1 of 1
APPLICATION NO. : 10/927583
DATED : March 27, 2007
INVENTOR(S) : Joseph Tzou et al.

It is certified that error appears in the above-identified patent and that said Letters Patent is hereby corrected as shown below:

At column 1, line 59, please replace "a" with -- ∝ -- so that the corresponding phrase reads -- event (∝) results --.

Signed and Sealed this

Twentieth Day of May, 2008

JON W. DUDAS
*Director of the United States Patent and Trademark Office*